United States Patent [19]
Cohen

[11] Patent Number: 5,615,224
[45] Date of Patent: Mar. 25, 1997

[54] APPARATUS AND METHOD FOR STABILIZATION OF THE BANDGAP AND ASSOCIATED PROPERTIES OF SEMICONDUCTOR ELECTRONIC AND OPTOELECTRONIC DEVICES

[75] Inventor: Daniel A. Cohen, Goleta, Calif.

[73] Assignee: The Regents of the University of California, Oakland, Calif.

[21] Appl. No.: 368,475

[22] Filed: Jan. 4, 1995

[51] Int. Cl.⁶ .......................... H01S 3/045; H01L 23/324
[52] U.S. Cl. .......................... 372/36; 257/718; 257/719; 372/44
[58] Field of Search .................... 372/36, 34, 43, 372/44; 257/718, 719

[56] References Cited

U.S. PATENT DOCUMENTS

| 3,303,432 | 2/1967 | Garfinkel et al. | 372/36 |
| 5,422,901 | 6/1995 | Lobby et al. | 372/36 |

Primary Examiner—James W. Davie
Attorney, Agent, or Firm—Daniel L. Dawes

[57] ABSTRACT

A structure for stabilizing the wavelength and output power of uncooled diode semiconductor lasers using stress caused by differential expansion to counteract the effects of temperature fluctuation is realized by restraining the thermal expansion of the active region. The thermal expansion is restrained first by encapsulating the active region of the laser within a low expansion cap, and second, by applying stress to the active region by means of a high thermal expansion stress element mechanically coupled to the active region and restrained within the low expansion cap. As the temperature of the laser increases and it would normally attempt to expand, the stress element expands to even a greater degree with the combination of the active region and stress element both being contained within the low thermal expansion cap. The result is that physical thermal expansion of the active region is substantially eliminated or reduced and it operates under higher internal pressure. The structure for counteracting the effects of thermal expansion in active regions is applicable not only to lasers but all optoelectronic devices, to semiconductor devices, and in general, to any device having a energy band gap or any other parameter of operation dependant on thermal expansion.

22 Claims, 7 Drawing Sheets

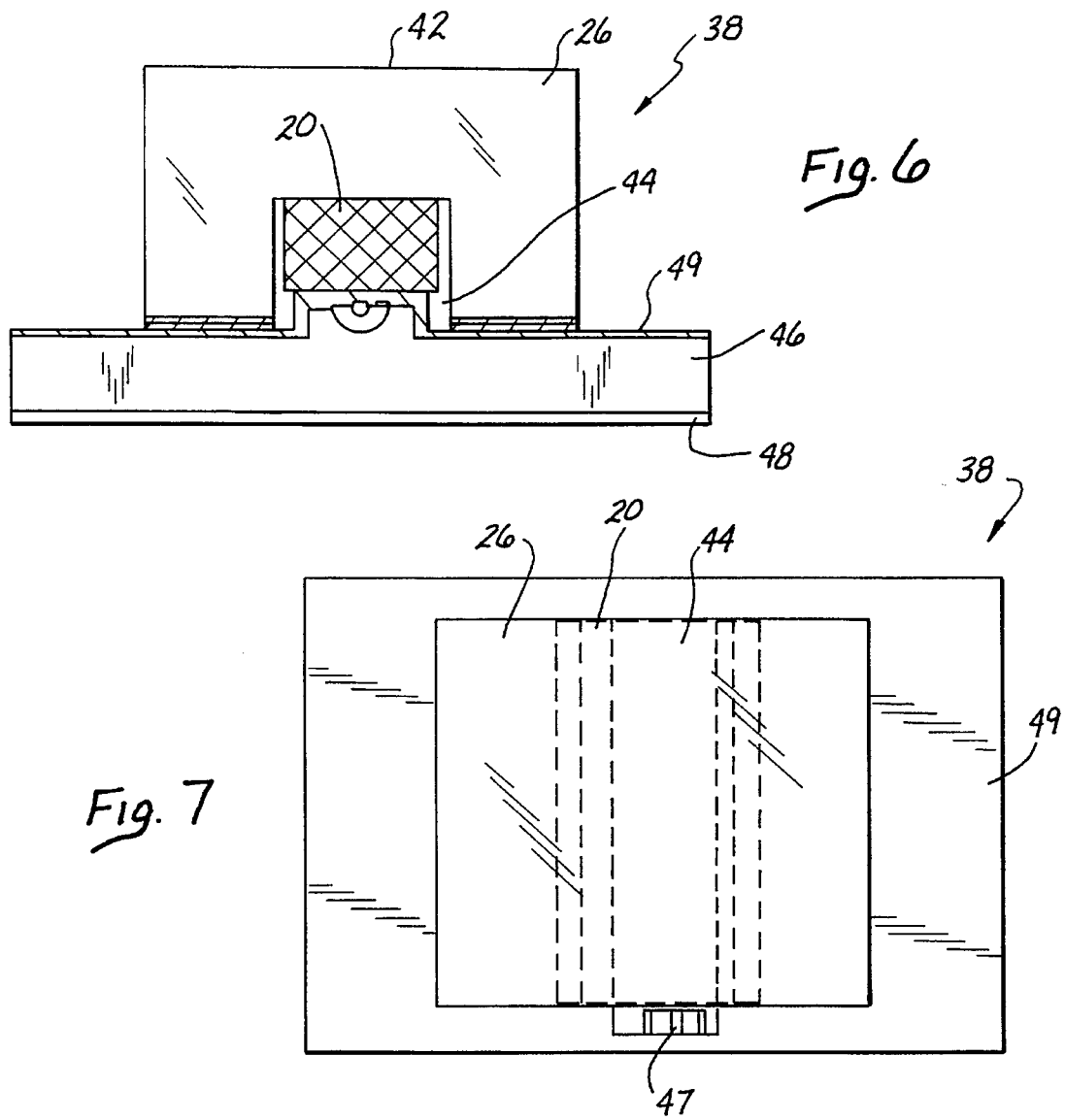

APPARATUS AND METHOD FOR STABILIZATION OF THE BANDGAP AND ASSOCIATED PROPERTIES OF SEMICONDUCTOR ELECTRONIC AND OPTOELECTRONIC DEVICES

This invention was made with Government support under Grant No. F19628-93-K-0023, awarded by the ARPA/Air Force. The Government has certain rights in this invention.

BACKGROUND OF THE INVENTION

1. Field of the Invention

The invention relates to the field of semiconductor electronic and optoelectronic devices, and in particular to ways in which the temperature-dependent variations of the operating parameters of such devices may be eliminated, reduced or controlled.

2. Description of the Prior Art

The bandgap and refractive index of materials or semiconductors are temperature sensitive and determine the operating parameters of the device. For example, threshold current, differential efficiency, and wavelength of diode lasers all vary with temperature, and are usually stabilized by using bulky, expensive, and unreliable thermoelectric coolers. Filters, couplers, switches and wavelength routers are also temperature dependant. It is currently the common practice to mount semiconductor, optoelectronic or integrated optical components on a heat sink attached to a thermoelectric cooler and a temperature sensor. An external feedback circuit is used to control the temperature of the components in order to stabilize the operating parameters of the optoelectronic or integrated optic component in a temperature varying environment. See, for example, C. E. Zah et al., *IEEE Journal of Quantum Electronics* 30, 511–22 (1994). The technique of providing a controlled cooler is expensive, requires a relatively large space and has excessive power requirements.

Some operating parameters of certain devices may be less temperature sensitive by specific design. For instance, the threshold current and external differential efficiency of some diode lasers have been made less temperature sensitive by using particular active region and waveguide designs as discussed by Zah above. Stability in threshold current and external differential efficiency at a wavelength of 1.31 microns has been demonstrated, but wavelength temperature-drift remains. As closely spaced wavelength division multiplexed (WDM) communication systems develop, this wavelength sensitivity will become a limit to the system capacity.

In a quantum well laser, the wavelength of peak gain occurs at the band edge, so in a simple Fabry-Perot cavity, the lasing wavelength simply follows the bandgap as the temperature fluctuates. In GaInAsP/InP lasers, this results in a wavelength drift of 0.3–0.5 nm/C. The wavelength of diode lasers may be made less temperature sensitive by using Bragg filters for wavelength selection in semiconductor lasers, such as in DFB and DBR lasers as discussed in G. P. Agrawal et al., *"Long Wavelength Semiconductor Lasers,"* Van Nostrand Company, New York (1986), and in silica or polymer waveguides, such as discussed by P. A. Morton et al., *"High-Power, Narrow Linewidth, Stable Single-Mode Hybrid Laser, Optical Fiber Communication,"* Optical Society of America, Volume 4, pages 102–3, (1994); and G. D. Maxwell et al., *"Semiconductor External-Cavity Laser with UV Written Grating in a Plain or Silica Waveguide, Optical Fiber Communication,"* Optical Society of America, pages 151–2, (1994). However, since the refractive index is dominated by the absorption at the band edge, even these structures will drift at 0.1 nm/C.

More recently, passive waveguides made from silica or polymers have been used which show very good temperature stability, such as described by Y. Kokubun et al., *IEEE Phototonics Technology Letters* 5, 1297–1300 (1993), but in this case, only the effective refractive index is stabilized and not the gain spectrum, and further, the method is not applicable to semiconductor devices.

Another current practice to temperature stabilize optoelectronic components is to couple them to passive dielectric waveguides which have an inherently reduced temperature sensitivity. The coupling may be entirely optical or the dielectric element may be included in a control loop. In the former case, only partial compensation may be achieved, since the semiconductor elements remain temperature sensitive. In the latter case, all the disadvantages of the temperature control loop are also present.

The effects of mechanical stress on the optical and electronic properties of semiconductors are well known. See for example A. R. Adams et.al., Semiconductor Science and Technology 5, 1194–1201 (1990). Stress produced by some monolithically integrated element has also been used to enhance the properties of some optoelectronic devices. For example, the stress from a deposited dielectric film has been used to create the waveguide region in a diode laser, as shown by P. A. Kirkby et al., Journal of Applied Physics 50, 4567–79 (1979). The stress from lattice-mismatched epitaxial layers has also been used to create quantum wire regions in semiconductor devices, as reported by I. H. Tan et al., Applied Physics Letters 59, 1875–77 (1991). However, never before has temperature-dependent stress been used to compensate for other temperature-dependent effects in semiconductor electronic or optoelectronic devices or components.

Semiconductor optoelectronic components, such as diode lasers are finding increased use in data and telecommunications as well as in optical sensors and optical computing. Because the energy band gap of semiconductors is dependent upon temperature, all properties related to band gap are also temperature dependent. In particular, the gain or loss spectrum and the index of refraction are temperature dependent. Because of this temperature dependence, the operating wavelength of diode lasers, with or without Bragg reflectors, and the operating wavelength of components, such as filters, detectors, switches and wavelength routers, is also necessarily temperature dependent. This dependence requires that the components be very carefully temperature controlled in many applications. It is expected that in fiberoptic communication systems employing many closely spaced wavelength channels, the requirement for optical temperature stability will be even greater. Therefore, it is the object of the invention to reduce or eliminate entirely, the temperature sensitivity of the optoelectronic component so that external temperature control of the optoelectronic or integrated optic component becomes unnecessary.

Therefore, what is needed is some type of apparatus or methodology whereby a semiconductor, optoelectronic or integrated optic component can be made less temperature sensitive in a manner which is adaptable for use in most, if not all, system applications, which provides stabilization of the bandgap, gain spectrum, and refractive index, and is also applicable to semiconductor electronic devices.

BRIEF SUMMARY OF THE INVENTION

The invention is an improvement in a device having an active region whose operational parameters are temperature-dependent as a function of thermal expansion. The improvement comprises a restraining structure mechanically coupled to the active region of the device. The restraining structure confines thermal expansion of the active region in at least one direction. As a result, operational fluctuation due to temperature dependence of the active region is reduced.

The improvement further comprises an expansion member mechanically coupled to the active region and to the restraining structure. The expansion member applies stress to the active region in at least one direction and is restrained by the restraining structure in at least one direction. The expansion member has a coefficient of thermal expansion greater than the active region. The restraining structure has a coefficient of thermal expansion less than the coefficient of thermal expansion of the expansion member.

In one embodiment the restraining structure restrains thermal expansion of the active region in a plurality of directions. The expansion member applies stress to the active region in a plurality of directions. The restraining structure and expansion member provide an approximately hydrostatic restraining force and the expansion member provides an approximately hydrostatic pressure on the active region.

In another embodiment the restraining structure encapsulates the active region on at least three sides. The expansion member encapsulates the active region on at least three sides.

More specifically, in the illustrated embodiment the device is disposed within a substrate and the active region is disposed within a mesa defined on the substrate. The restraining structure is comprised of a cap disposed about the mesa. The cap has a substantially lower coefficient of thermal expansion than the mesa. The cap is mechanically coupled to and adjacent to at least three sides of the mesa to restrain thermal expansion of the mesa.

The improvement further comprises an expansion member disposed on and mechanically coupled to the mesa. The expansion member is disposed within the cap and restrained thereby. The expansion member has a substantially greater coefficient of thermal expansion than the mesa so that the expansion member applies the stress to the mesa in response to temperature increases of the mesa and expansion member.

The restraining structure is comprised of silicon dioxide or material having similar or smaller thermal coefficients of expansion, and the expansion member is comprised of gold or material having similar or greater thermal coefficients of expansion.

The improvement is used in a device which is an optoelectronic device and/or a semiconductor electrical device.

In one embodiment the mesa is shorter or smaller than the expansion member so that stress exerted by the expansion member on the mesa is increased.

In another embodiment the mesa has a passivating dielectric layer disposed thereon which substantially encapsulates the mesa.

Preferably, the mesa is dovetail shaped in at least one cross section so that stress applied to the mesa is approximately hydrostatic.

The invention may be better visualized by now turning to the following drawings wherein like elements are referenced by like numerals.

BRIEF DESCRIPTION OF THE DRAWINGS

FIG. 6 is a side elevational view of a bipolar transistor incorporating the invention.

FIG. 7 is a top plan view of the transistor of FIG. 6.

FIG. 8 is a side elevational view of a rectifier in combination with an increased thermal stress element according to the invention.

FIG. 11b is a top elevational view of the laser shown in FIG. 11a.

Figure 1:
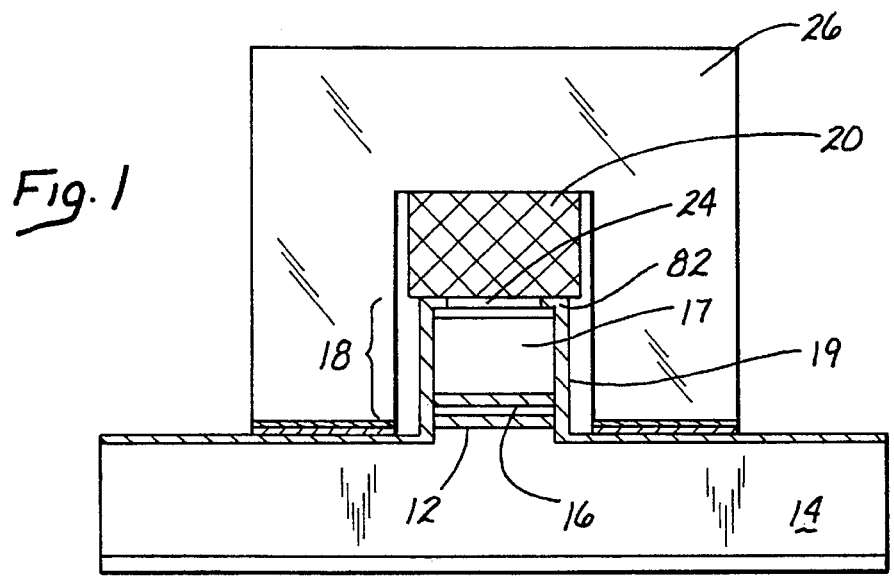
FIG. 1 is a simplified perspective view of the invention showing an end cross sectional view.

The invention and its various embodiments may now be better understood by turning to the following detailed description.

DETAILED DESCRIPTION OF THE PREFERRED EMBODIMENTS

A structure for stabilizing the wavelength and output power of uncooled diode semiconductor lasers using stress caused by differential expansion to counteract the effects of temperature fluctuation is realized by restraining the thermal expansion of the active region. The thermal expansion is restrained first by encapsulating the active region of the laser within a low expansion cap, and second, by applying stress to the active region by means of a high thermal expansion stress element mechanically coupled to the active region and restrained within the low expansion cap. As the temperature of the laser increases, it would normally attempt to expand. The stress element expands to an even a greater degree, with the active region and stress element both being contained within the low thermal expansion cap. The result is that physical thermal expansion of the active region is substantially eliminated or reduced and the device operates under higher internal pressure.

The structure for counteracting the effects of thermal expansion in active regions is applicable not only to lasers but all optoelectronic devices, to semiconductor electronic devices, and in general, to any device having an energy band gap or any other property or parameter of operation that is dependant on thermal expansion.

In the illustrations discussed below, optoelectronic devices, and in particular ridge lasers, will be described. However, it is to be expressly understood that the invention is applicable to any type of material or semiconductor wherein the operating parameters are dependent upon thermal expansion, or on the thermal dependence of the energy band gap.

If the band gap can be stabilized, then in optoelectronic devices both the gain spectrum and refractive index can also be stabilized. The band gap, $E_g$, is proportional to the lattice constant. It is known that changes in the lattice constant due to pressure have the same effect on $E_g$ as do equivalent changes in the lattice constant due to temperature. If the pressure, P, is made to increase with the increasing temperature, T, according to the following equation:

$$\frac{dE_g(T,P)}{dT} = \frac{2E_g}{2T} + \frac{2E_g}{2P}\frac{2P}{2T} = 0$$

then the net band gap drift with temperature vanishes. The partial derivative of the band gap energy with respect to temperature represents the band gap shift with temperature at constant pressure. The partial derivative of band gap energy with respect to pressure is the band gap shift with pressure at constant temperature.

The same thermal stress is used to obtain stabilization of the threshold current and differential efficiency. It has been demonstrated in the art that in GaInAs/InP lasers with unstrained active regions, the threshold current is reduced and the differential efficiency is increased when hydrostatic pressure is applied, primarily due to a reduction in the intervalence band absorption. Power stabilization may be obtained by using the temperature-dependent stress to produce a temperature-dependent reduction in loss. Epitaxially strained quantum wells also have reduced loss, and their use may provide an additional degree of freedom to obtain stabilization.

Mechanical stresses induced by fluctuations in temperature can be made to compensate for changes in the gain spectrum and refractive index that would otherwise accompany temperature fluctuations by appropriately incorporating materials with different thermal expansion coefficients in the proximity of the waveguide region of the optoelectronic device. Similar mechanical stresses may be used to compensate for changes in the reverse leakage current, forward injection current, and power handling capacity of semiconductor electronic devices such as junction diodes and bipolar transistors. Temperature compensation, thus, is automatic and no temperature sensing or feedback circuitry or methodology is required, no temperature control or compensation is required, both the gain spectrum and refractive index are compensated and the solution is applicable to a wide variety of devices, including but not limited to semiconductor lasers, detectors, optical filters, switches, wavelength routers, and electronic devices.

Optoelectronic and integrated optical devices are constructed in a wide variety of geometries and from a wide variety of materials. Nevertheless, all these devices have an active region or in the case of many optoelectronic devices, a waveguide region, as a component part in which the optical energy is at least partially contained. A cross-sectional side view of such a waveguide region is shown in a device generally denoted by reference numeral 10 in FIG. 1. The waveguide region is generally denoted by reference numeral 12. Waveguide 12 may be defined in a plane parallel to a substrate 14 on which or in association with which a device is fabricated, or perpendicular to the substrate, as in vertical cavity devices. For the sake of simplicity, an in-plane device is shown in FIG. 1.

Also, typically, there is an active region 16 embedded in or in close proximity to waveguide 12 in which the optical energy is generated, absorbed or otherwise modified. The waveguide region may be adjacent to a lower cladding region 15, which may be the substrate 14, and to an upper cladding region 17. The operation of the device will, in general, depend upon the gain, loss and refractive index of its material elements, which typically include the waveguide region 12, active region 16, and the cladding regions. The exact details or structure of active region 16 or waveguide 12 are inconsequential to the invention as long as they are substantially contained within the region where pressure will be thermally created or directed as described below. The cladding, waveguide, and active region, along with a contact layer 82, are collectively called a ridge or mesa 18.

The operational properties, such as gain, loss, and refractive index, will also depend upon the stress in the material of these elements. If the stress in ridge 18 is made to change appropriately in response to the temperature change of the device, the net effect on the gain, loss or refractive index may be minimized or even cancelled entirely.

In the present invention, the stress is made to respond to temperature by placing materials with differing thermal expansion coefficients in mechanical contact or coupling with ridge 18, so that the thermally induced stresses due to differential expansion cause strains in waveguide region 12, active region 16 and cladding layers 15 and 17 in an opposing direction to their own normal thermal expansion. Since there are virtually arbitrary geometries for optoelectronic devices, the specific manner in which compensating stress may be developed through the use of different materials is open ended. Any means, way, or method by which materials might be incorporated into the device to provide an offsetting stress is expressly included within the scope of the present invention.

One such geometry is the laser ridge shown in FIG. 1, and it must be expressly understood that the geometry of any particular embodiment of the invention could be radically different from that shown in FIG. 1, and thus the elements by which the stress may be introduced can be radically different in different geometries, and yet the spirit and scope of the invention would still have been incorporated.

In the illustrative embodiment of FIG. 1, substrate 14 is formed to define a ridge laser 18 with a stress element 20 longitudinally disposed thereon. Stress element 20 is made from a material with a high thermal expansion coefficient such as gold and is in contact with ridge 18 through a thin electrical contact layer 24. The electrical contact layer 24 may itself be composed of multiple layers, such as titanium and gold. The choice of materials will clearly vary depending upon the application at hand. Stress element 20 is in contact on its upper longitudinal surface with a cap 26 made of low expansion, stiff material such as silicon dioxide or tungsten. In this embodiment, the cap is either made from an electrically conductive material such as tungsten, or is made from an electrically insulating material that has been coated with an electrically conductive layer, such as gold. An electrically insulating dielectric layer 19 isolates the substrate and the sidewalls of the ridge. The low-expansion cap 26 is bonded to the dielectric-coated substrate with a thin bonding layer such as palladium. The bonding layer is thin enough so that its own thermal expansion does not interfere with device operation.

For ease of manufacturability, low cost, and high reliability, it is contemplated that the optoelectronic device or component will incorporate the stress-producing elements, such as stress element 20 and cap 26, by monolithic construction techniques on an optoelectronic device wafer as depicted in FIGS. 2a–d. The optoelectronic device is first fabricated up to the point just prior to die separation. Prior to die separation, the structures, such as stress element 20 and cap 26, are fabricated over the nearly completed devices on the wafer.

Figure 2E:
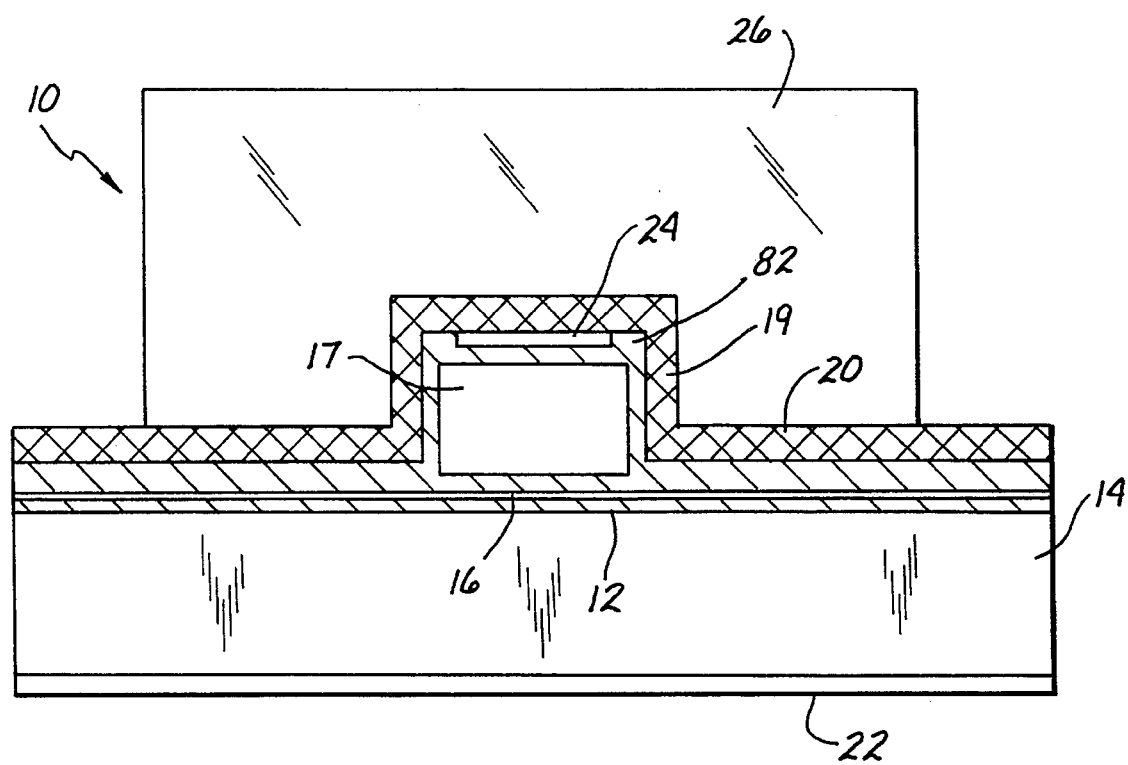
FIGS. 2a–2e illustrate the method of making a ridge laser according to the invention using conventional microelectronic fabrication techniques.
Figure 2A:
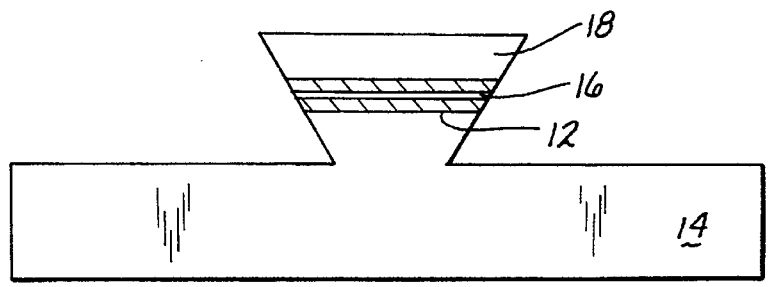
Figure 2B:
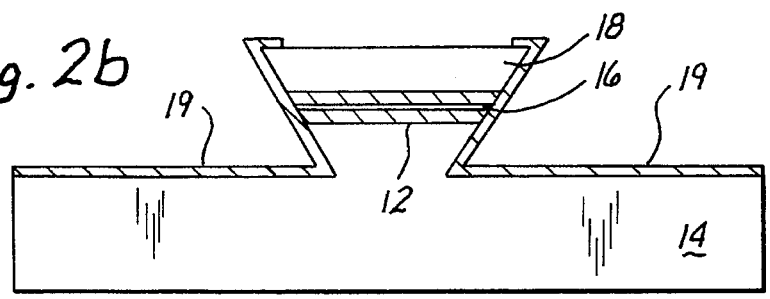
Figure 2C:
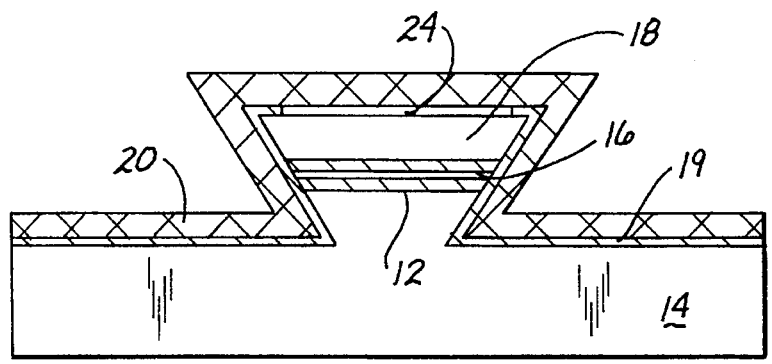

For example, in the embodiment of FIGS. 2a–d, a dovetail shaped laser ridge 18 is conventionally fabricated resulting in the structure of FIG. 2a. A dovetail ridge geometry such as shown in FIGS. 2a–d and 3a–d is preferred because the resulting thermal stress at the active layer will be approximately hydrostatic, allowing the largest stress without mechanical failure, as well as producing the largest effect on the band gap minimum. A dielectric insulating layer of silicon nitride 19 is deposited and patterned over ridge 18 and selectively etched back using conventional photolithographic techniques to expose the top surface of laser ridge 18 as shown in FIG. 2b. An electrical contact metal 24 is deposited on the exposed surface. A high expansion stress inducing element or layer 20 is then deposited and patterned on top of ridge 18 as shown in FIG. 2c. The low-expansion cap 26 is disposed and patterned by conventional microelectronic fabrication techniques to result in the structure of FIG. 2d. Stress element 20 and cap 26 may be deposited by methods commonly used in the microelectronic industry, such as evaporation, sputtering, or chemical vapor deposition.

To simplify fabrication, a device having a ridge structure with nearly vertical sidewalls, and etched only to the top of the waveguide layer 12, is shown in FIG. 2e. In this embodiment active region 16 is comprised of six unstrained GaInAs quantum wells separated by GaInAsP barriers (1.1 micron band gap wavelength), with InP cladding layers, grown on an InP substrate. The ridge 18 and substrate 14 are insulated with a 300 nanometer thick silicon nitride layer 19, and an opening in this layer is etched on top of the ridge for electrical contact. A thin electrical contact layer 24 comprised of 10 nanometers of titanium is deposited on top of the ridge, and over the dielectric-insulated substrate 22, followed by 400 nanometers of gold. This gold layer serves as both an electrical contact layer, and as the stress-producing element 20. The low-expansion layer 26 is comprised of silicon dioxide three microns thick, deposited by plasma-enhanced chemical vapor deposition at 50 degrees C. This low temperature of deposition permits the use of relatively thick films and allows minimization of the stress at room temperature. The thick silicon dioxide layer is patterned to allow access to the gold layer below it, for electrical contact. Channels are chemically etched in the silicon dioxide layer 26, and in the gold layer 20, perpendicular to the ridges, to allow cleaving devices at the end of fabrication. Device fabrication is then finished, and another electrical contact is made to the back side of the substrate, as in common practice. With this structure, a reduction in wavelength temperature sensitivity of ten percent, over a fifteen degree C. temperature range, has been achieved. Improvements are expected through the use of better geometries and material compositions for cap 26, i.e. bulk silicon dioxide, as opposed to vapor deposited silicon dioxide, so that complete temperature compensation over −40 to +85 degrees C. should be attainable.

In the limiting case where there is zero expansion of cap 26, such as by using an infinitely stiff, zero-expansion outer material in cap 26 and dielectric layer 19, the need for stress element 19 could be reduced entirely, since thermal expansion of the semiconductor lattice would be completely restrained by the outer cap. In such an ideal case, even instantaneous temperature fluctuations produced by the device itself would be compensated. This would improve the low frequency FM response of diode lasers, as well as improve the tuning range of wavelength-tunable diode lasers, both of which suffer parasitic thermal effects.

As the temperature of device 10 increases, stress element 20 expands more than either ridge 18 or cap 26, thereby exerting an increased stress on ridge 18. This stress propagates into the device including active region 16 and waveguide region 12. To the extent that ridge 18 is encapsulated or confined, the stress or pressure exerted by element 20 on ridge 18 is actually or approximately hydrostatic or omnidirectional. By choosing appropriate materials and dimensions, the amount of change in stress for a given temperature change can be adjusted as desired so that the net change in the energy band structure can also be adjusted as desired.

Figure 3A:
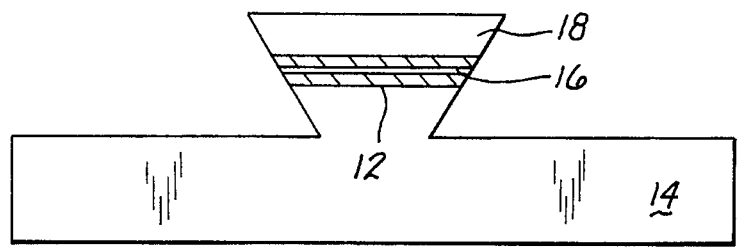
FIGS. 3a–3d illustrate the method of making a ridge laser according to the invention using wafer bonding techniques.
Figure 3B:
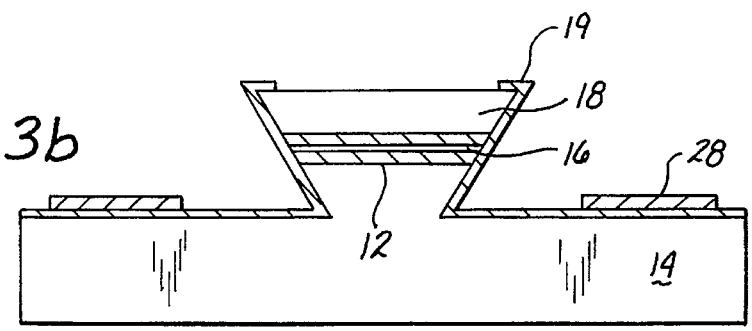
Figure 3C:
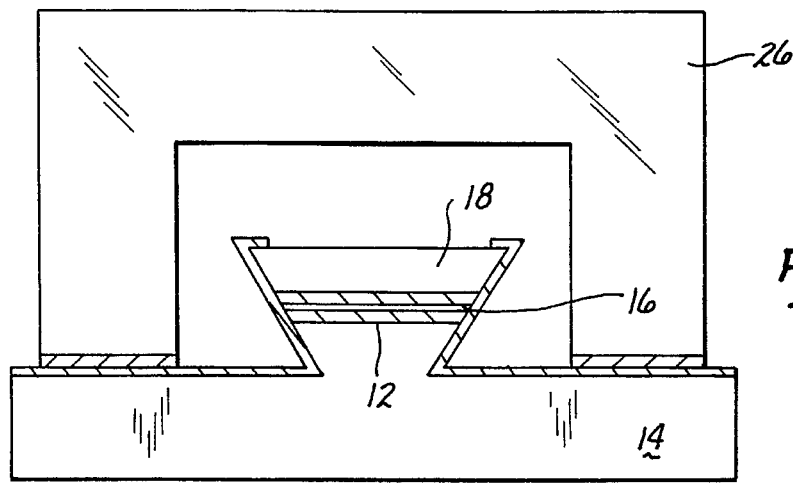
Figure 3D:
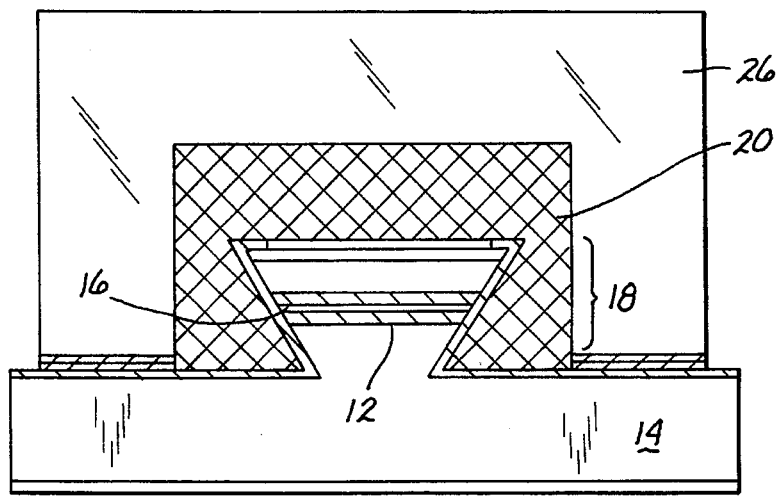

At present, there is a limited variety of materials that may be deposited by common microelectronic fabrication techniques, and the thermal and mechanical properties of these films are usually inferior to the properties of the materials in their bulk forms. Alternatively, the low-expansion cap may be fabricated from bulk material, and bonded to the substrate, as described next. FIGS. 3a–d diagrammatically illustrate fabrication of a ridge laser according to the invention using wafer bonding techniques. As before, ridge laser 18 is fabricated by conventional techniques to assume the basic structure shown in FIG. 3a. Dielectric layer 19 is disposed on the surface of substrate 14 and ridge 18, and etched back to expose the upper contact surface of ridge 18. Bonding pads 28 are disposed adjacent to ridge 18 on top of dielectric layer 19 in preparation of the disposition of cap 26 as depicted by the structure in FIG. 3b. Cap 26 is fabricated from bulk material bonded to a carrier wafer 30, and patterned by conventional lithography and etching techniques. The areas that will be in contact with the substrate have bonding pads 29 similar to pads 28 deposited on the substrate. It is then aligned over the device wafer and bonded to pads 28 as shown in FIG. 3c. The carrier wafer 30 may then be removed from cap 26 either by melting or dissolving a bonding layer between wafer 30 and cap 26, or etching or grinding away carrier wafer 30 according to conventional wafer techniques. Stress element 20 is then electroplated between cap 26 and passivated ridge 18 as shown in FIG. 3d. The device may then be completed with further processing steps and the dies separated as in conventional fabrication techniques.

The cap is either made from conducting material or coated with a conductive material, so that electrical contact to the laser may be made through conducting cap 26 and stress element 20. A back electrode is formed on semiconductor substrate 14 for the second contact.

Figure 2D:
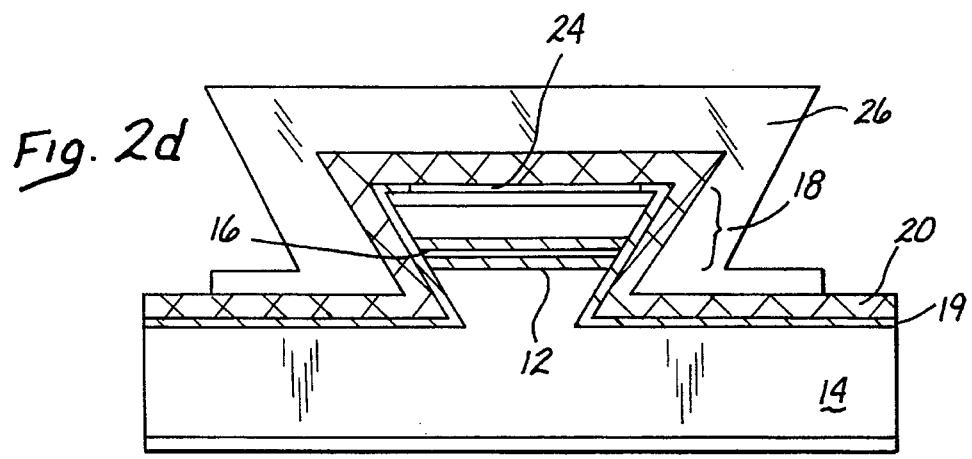

The effects of hydrostatic stress are different from the effects of uniaxial, biaxial or sheer stress. In general, there will be components of all of these types of stresses present. In most cases, hydrostatic stress is the most beneficial, although other stress components may be useful to obtain a specific temperature response. In the embodiment of FIG. 3d, high expansion element 20 surrounds semiconductor ridge 18 rather than just contacting the ridge top. The resulting thermal stress is therefore closer to hydrostatic. Low expansion cap 26 is first bonded to the substrate and then high expansion element 20 is deposited. In the embodiment of FIG. 2d, low expansion cap 26 is deposited using microelectronic fabrication techniques such as evaporation, sputtering or chemical vapor deposition. In the method described in FIGS. 2a–d, high expansion element 20 is deposited first and then low expansion cap 26 is deposited on top of it. Electrical contact is made through high expansion element 20 and low expansion cap 26 is patterned to allow access.

Figure 11A:
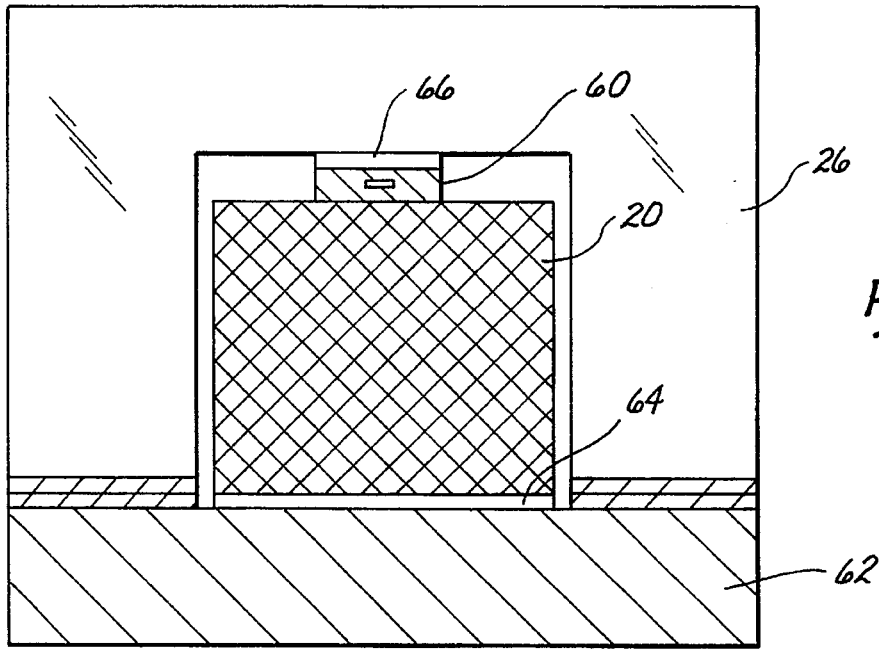
FIG. 11a is side cross-sectional view of laser made according to another embodiment of the invention.
Figure 11B:
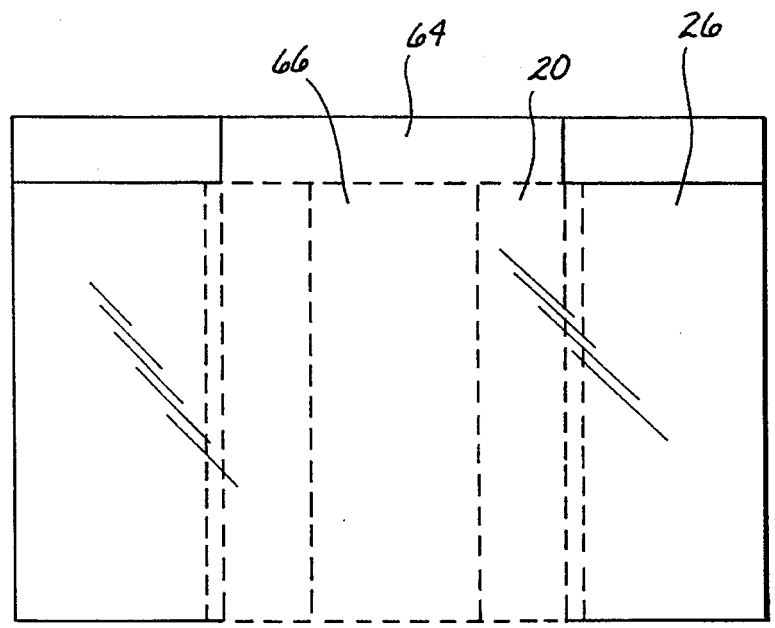

Stress element 20 and cap 26 may also be constructed by bulk mechanical fabrication, inserting an otherwise typical device into a fixture comprised of a high-expansion element and a low-expansion rigid case. Such an implementation is illustrated in FIG. 11a. In this implementation, a GaInAsP/InP buried heterostructure laser 60 fabricated by conventional techniques is soldered in chip form to a high-expansion mount made of copper, which comprises both the stress element 20, and an electrical contact to the laser chip. This mount is then bonded to base 62, upon which has been deposited and patterned an electrical contact layer 64 to enable electrical contact to the high-expansion mount. A low-expansion cap 26 is then bonded to the substrate in such a way as to also make mechanical contact with the top of the laser chip. The low-expansion cap is either made from an electrically-conducting material, such as tungsten, or from an electrically insulating material which has been coated with an electrically conducting layer. The final electrical and mechanical contact between the laser chip and the low-expansion mount may be achieved by electroplating a metal 66 in the space between the two pieces. The cap 26 is positioned on the substrate so as to allow access to the lower electrical contact, as shown in FIG. 11b. One advantage of this approach is that a very wide range of device geometries, for both electronic and optoelectronic devices, may be used.

Combinations of these various approaches, such as using bulk fixtures and electroplating the mechanical contact between stress element 20 and cap 26, may offer advantages in one particular application over another and can be chosen according to the particular application at hand.

The invention is also illustrated in connection with a rectifier or junction diode such as shown in the side cross-sectional view of FIG. 4 and the corresponding top plan view of FIG. 5. In a rectifier, or junction diode, thermal stress may be used to temperature compensate the reverse saturation current and the forward injection current and to allow higher temperature and higher power operation. The rectifier, generally denoted by reference numeral 32, is shown as having a diffused n-doped region 50 disposed in a mesa 44 on a p-type substrate 34. Ion implanted or epitaxially grown junctions may also be used, a p-doped region may be disposed in an n-type substrate or n and p wells may be disposed in semi-insulating substrates.

Figure 4:
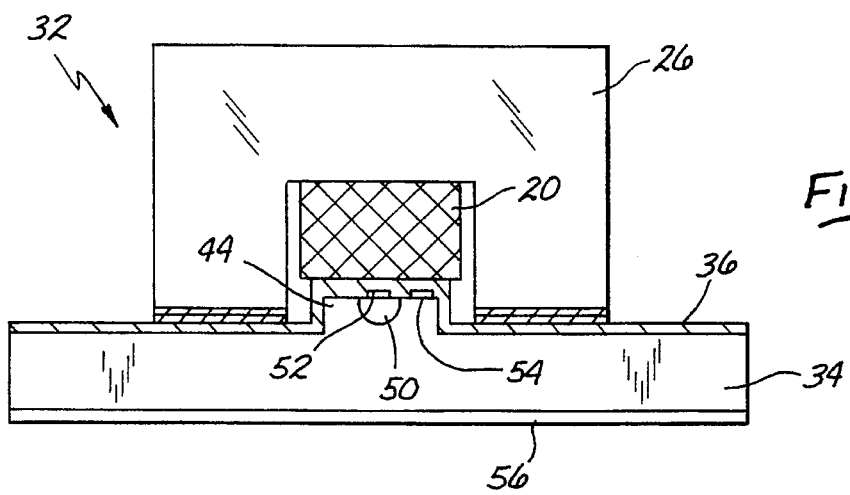
FIG. 4 is a side elevational view of a rectifier incorporating the invention.
Figure 5:
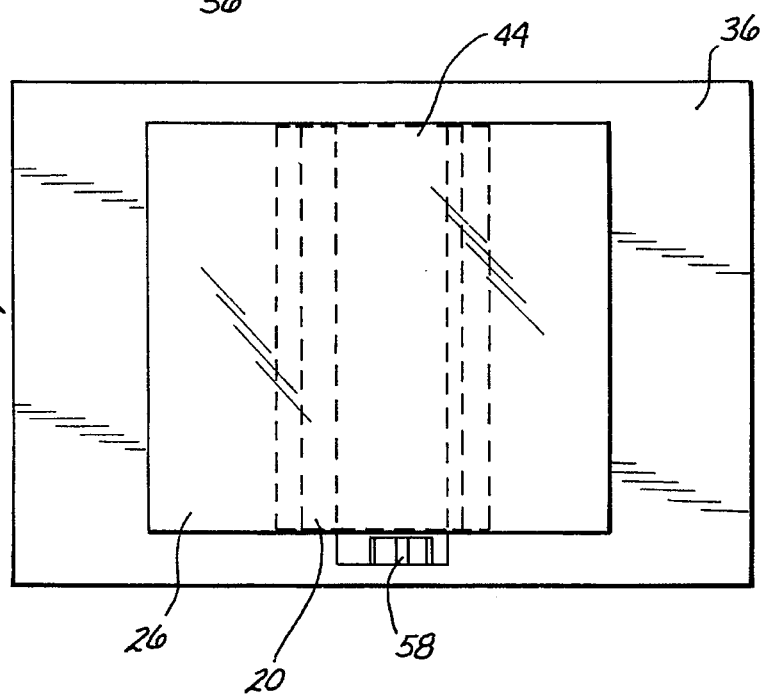
FIG. 5 is a top plan view of the rectifier of FIG. 4.

In the embodiment of FIGS. 4 and 5, a cathode contact 52 and anode contact 54 are formed. A dielectric layer 36 is shown insulating the rectifier electrical contacts 52 and 54 from high expansion stress element 20 and low expansion cap 26. Dielectric layer 36 is selectively removed from a small window 58 as shown in FIG. 5 in an area which is not covered by cap 26 to permit access to contacts 52 and 54. An optional contact 56 is disposed at the back of substrate 34 if needed. In the embodiment of FIGS. 4 and 5, low expansion cap 26 is bonded to the dielectric-insulated rectifier substrate 34 prior to depositing or disposing by electroplating high expansion element 20 therebetween.

FIGS. 6 and 7 illustrate the application of the invention in a bipolar junction transistor, generally denoted by reference numeral 38, which is shown in cross-sectional side view in FIG. 6 and top plan elevational view in FIG. 7. In junction transistor 38, thermal stress may be used to temperature compensate the current gain and to allow higher temperature and higher power operation. The implementation of FIGS. 6 and 7 is similar to that shown with respect to the rectifier in FIGS. 4 and 5. Contacts 40 and 42 for the emitter and base regions are provided on the top of mesa 44 in which these regions are disposed. The regions themselves may be fabricated by conventional bipolar technology. A third contact for the collector region may also be added on top of the mesa if needed, for example, if substrate 46 is semi-insulating. For conducting substrates, a back contact 48 may be used. Electrical contacts 40 and 42 on the top of mesa 44 are insulated with a dielectric layer 49 with access to top contacts 40 and 42 provided through a window 47 shown in FIG. 7, which has been selectively opened in dielectric layer 49 in an area not covered by cap 26 or stress element 20.

In the implementation of FIGS. 6 and 7, cap 26 is bonded to the dielectric-insulated substrate 46 prior to deposition of high expansion element 20. As in FIGS. 4 and 5, the junctions within bipolar transistor 38 may be formed by diffusion, ion implantation or epitaxial growth and may be built in the form of npn or pnp devices as desired.

FIG. 8 shows in a cross-sectional side view, one method to achieve greater stress on the semiconductor for a given temperature change. This increase is obtained by using a proportionally larger expansion element 20. Low expansion cap 26 is extended underneath widened expansion element 20 to provide better restraint of the expansion of mesa 44 in the plane of the substrate. Other details are similar to the device shown in FIG. 4.

Figure 9A:
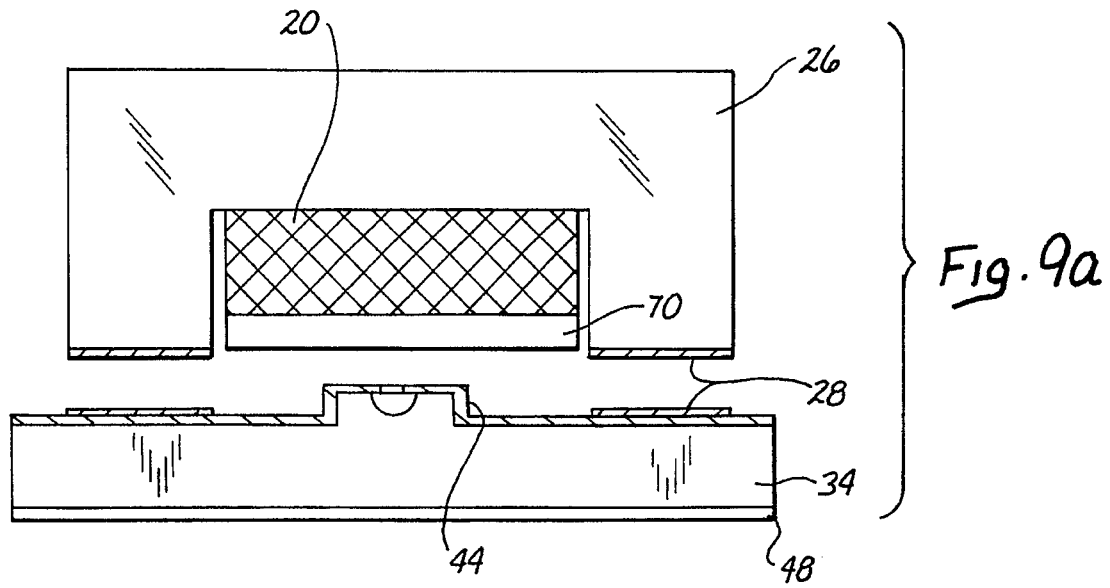
FIGS. 9a and 9b are side elevational views of a device made in combination with an embossed layer according the invention.
Figure 9B:
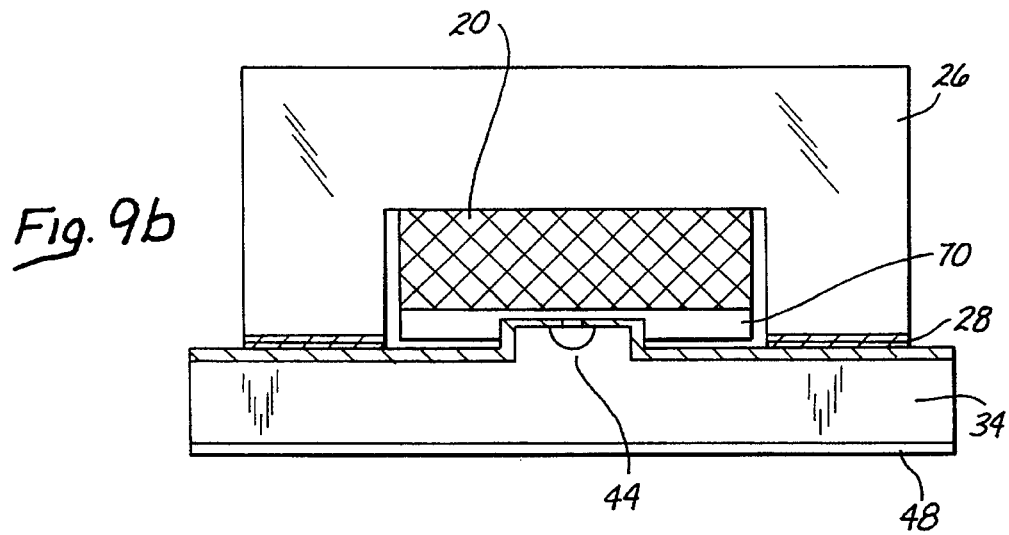

FIGS. 9a and 9b illustrate another embodiment of a method to fabricate a stress compensated rectifier. High expansion element 20 is attached to low expansion cap 26 with an optional embossing layer 70 attached to the bottom surface of high expansion element 20 as shown in the cross sectional side view of FIG. 9a. The assembly, comprised of cap 26, stress element 20 and embossing layer 70 is then pressed into contact with semiconductor substrate 34, forming the necessary physical contact between the semiconductor and stress elements. The embossing layer, or the stress element itself in the absence of an embossing layer, deforms until the low expansion cap 26 makes contact with its bonding pad on substrate 34. Low expansion cap 26 is then bonded to substrate 34 as described in previous embodiments. Electrical contact to the top of mesa 44 may be made in a manner similar to those described in FIGS. 4–8, or as alternatively shown in FIG. 9a and 9b, contact may be made directly through embossing layer 70 and high expansion element 20, through cap 26 or through a conducting coating provided on low expansion cap 26. FIGS. 9a and 9b illustrate the rectifier structure described in connection with FIG. 4, but any type of device may be fabricated using the assembly technique generally shown in these Figures.

Figure 10:
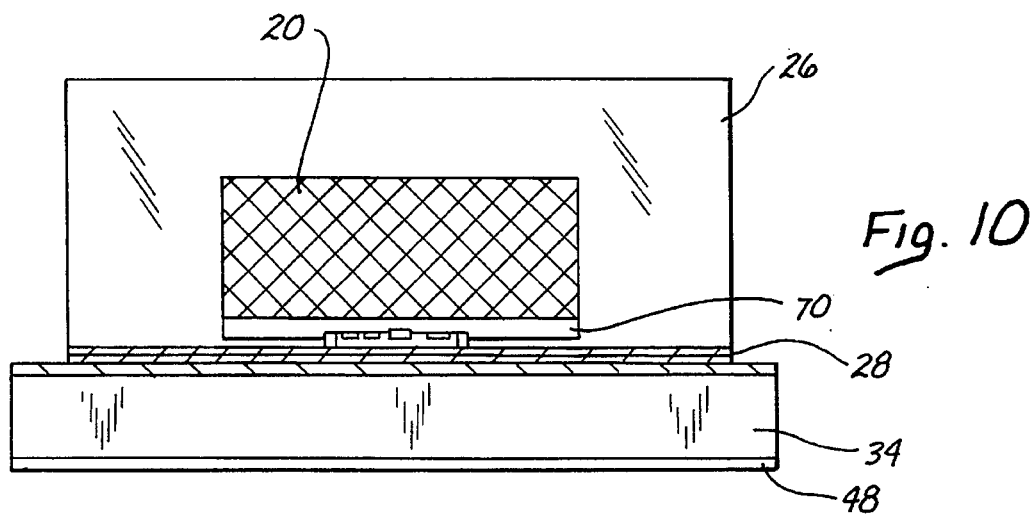
FIG. 10 is a side elevational view of a rectifier enclosed on all sides by the stress element and used in combination with an embossed layer according to the invention.

FIG. 10 shows another embodiment wherein rectifier 32 is enclosed on all sides in combination with an embossed stress element 70. When access to cleaved or etched edges is not necessary, mesa structure 44 may be enclosed on five sides by the stress elements as shown in FIGS. 10. This method of fabrication provides additional restraint of the expansion of the semiconductor and increased stress for a given temperature change. Although the embodiment of FIG. 10 contemplates the use of an embossed assembly, electrodeposition of high expansion element 20 after bonding with low expansion cap 26 to substrate 34 may also be used by employing vias through the top of cap 26 for the electrolyte to pass during the electroplating step.

Figure 12:
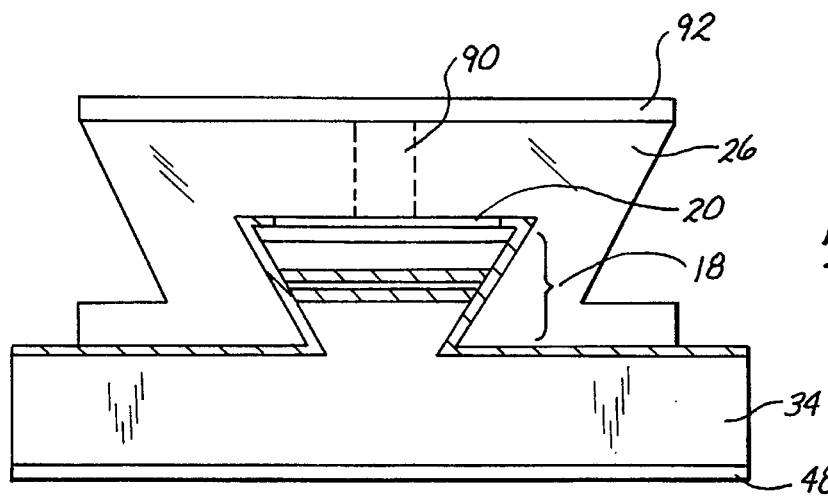
FIG. 12 is a side elevational view of a dovetail optoelectronic device enclosed on three sides by only a low expansion cap according to the invention.

FIG. 12 illustrates an alternative embodiment to the device fabricated according to the methodology of FIGS. 2a–2d. In devices requiring very fast response to changing temperature, such as due to modulation currents, high expansion element 20 may be reduced in size or eliminated entirely. Some or all of the benefits of thermal stress may still be obtained depending upon the properties of low expansion cap 26. The embodiment of FIG. 12 as shown in side cross-sectional view, has a via 90 that is defined through low expansion cap 26. The high stress element 20 is removed entirely or reduced to a thin contact layer 20' on the top of ridge 18. Electrical contact is then made through via 90 through a top electrode 92 disposed on top of cap 26.

It can now be appreciated that the prior art practice of stabilizing bandgap, gain, loss spectra, and refractive index by carefully controlling the device temperature using a thermoelectric cooler, temperature sensor and external control circuit is relatively expensive, requires a large package volume compared to the device itself, consumes an excessive amount of electrical power and requires a heat removal path from a heat sink.

The response time of such a prior art control loop is also relatively slow due to the large thermal mass of the thermoelectric cooler and heat sink to which the optoelectronic device is bonded. The advantage of the present invention is that it eliminates the need for all of these temperature control elements and therefore reduces the cost of the package device, and the cost and complexity of the system to which it is incorporated.

Furthermore, because the temperature compensation elements of the invention are integrated monolithically with the electronic or optoelectronic device itself, these compensation elements are small and have low thermal mass so that they are able to quickly respond to temperature fluctuations. Quick response to temperature fluctuations is important when the fluctuations are caused by changes in the operating parameters of the device itself, such as a change in the bias current required to change the optical output power of a laser. By reducing the complexity and power requirements of individual devices, it becomes practical to construct large arrays of devices for high power and parallel operation which would otherwise not be possible.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result.

In addition to the equivalents of the claimed elements, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An improvement in a semiconductor device having an active region whose operational parameters are temperature-dependent as a function of a coefficient of thermal expansion of materials from which said semiconductor device is composed, said improvement comprises:

a restraining structure mechanically coupled to said active region of said semiconductor device, which restraining structure confines thermal expansion of said active region in at least one direction, whereby operational variation due to temperature dependence of said active region is reduced.

2. The improvement of claim 1 further comprising an expansion member mechanically coupled to said active region and to said restraining structure, said expansion member applies stress to said active region in said at least one direction and is restrained by said restraining structure opposite to said at least one direction.

3. The improvement of claim 1 wherein said restraining structure has a coefficient of thermal expansion less than the coefficient of thermal expansion of said active region.

4. The improvement of claim 2 wherein said restraining structure has a coefficient of thermal expansion less than the coefficient of thermal expansion of said active region.

5. The improvement of claim 4 wherein said expansion member has a coefficient of thermal expansion greater than said active region.

6. The improvement of claim 2 wherein said restraining structure has a coefficient of thermal expansion less than the coefficient of thermal expansion of said expansion member.

7. The improvement of claim 1 wherein said restraining structure restrains thermal expansion of said active region in a plurality of directions.

8. The improvement of claim 2 wherein said expansion member applies stress to said active region in a plurality of directions.

9. The improvement of claim 8 wherein said restraining structure restrains thermal expansion of said active region in a plurality of directions.

10. The improvement of claim 9 wherein said restraining structure and expansion member provide an approximately hydrostatic restraining pressure and said expansion member provides an approximately hydrostatic pressure on said active region.

11. The improvement of claim 1 wherein said restraining structure provides an approximately hydrostatic restraining pressure on said active region.

12. The improvement of claim 1 wherein said restraining structure is disposed adjacent to and is directly or indirectly in mechanical contact with said active region on at least three sides.

13. The improvement of claim 1 wherein said expansion member is disposed adjacent to and is directly or indirectly in mechanical contact with said active region on at least three sides.

14. The improvement of claim 12 wherein said expansion member is disposed adjacent to and is directly or indirectly in mechanical contact with said active region on at least three sides.

15. The improvement of claim 1 wherein said semiconductor device is disposed within a substrate and said active region is disposed within a mesa defined on said substrate, said restraining structure comprising a cap disposed about said mesa, said cap having a substantially lower coefficient of thermal expansion than said mesa, said cap being mechanically coupled to and adjacent to at least three sides of said mesa to restrain thermal expansion of said mesa.

16. The improvement of claim 2 wherein said semiconductor device is disposed within a substrate having a mesa, and said active region is disposed within said mesa, said restraining structure comprising a cap disposed about said mesa, said expansion member disposed on and mechanically coupled to said mesa, said expansion member being disposed within said cap and restrained thereby, said expansion member having a substantially greater coefficient of thermal expansion than said mesa, said restraining structure having a coefficient of thermal expansion substantially lower than said expansion member so that said expansion member applies stress to said mesa in response to temperature increases of said mesa and expansion member.

17. The improvement of claim 16 wherein said restraining structure is comprised of silicon dioxide or material having similar or smaller thermal coefficients of expansion, and wherein said expansion member is comprised of gold or material having similar or greater thermal coefficients of expansion.

18. The improvement of claim 1 wherein said semiconductor device is an optoelectronic device.

19. The improvement of claim 1 wherein said semiconductor device is a semiconductor electrical device.

20. The improvement of claim 16 wherein said mesa has a first predetermined dimension in a predetermined direction and wherein said expansion member has second predetermined dimension in said predetermined direction, said second dimension of said expansion member being greater than said first dimension of said mesa so that stress exerted by said expansion member on said mesa is increased.

21. The improvement of claim 15 wherein said mesa is dovetail shaped in a least one cross section so that stress applied to said mesa tends to be hydrostatically applied to said active region within said mesa.

22. The improvement of claim 16 wherein said mesa is dovetail shaped in a least one cross section so that stress applied to said mesa is tends to be hydrostatically applied to said active region within said mesa.

* * * * *